(12) United States Patent
Kumar et al.

(10) Patent No.: US 9,502,102 B1
(45) Date of Patent: Nov. 22, 2016

(54) MLC OTP OPERATION WITH DIODE BEHAVIOR IN ZNO RRAM DEVICES FOR 3D MEMORY

(71) Applicant: Crossbar, Inc., Santa Clara, CA (US)

(72) Inventors: Tanmay Kumar, Pleasanton, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 5 days.

(21) Appl. No.: 14/341,726

(22) Filed: Jul. 25, 2014

(51) Int. Cl.
- *G11C 13/02* (2006.01)
- *G11C 11/56* (2006.01)
- *H01L 45/00* (2006.01)
- *G11C 13/00* (2006.01)

(52) U.S. Cl.
CPC ....... *G11C 11/5692* (2013.01); *G11C 13/0007* (2013.01); *G11C 13/0011* (2013.01); *H01L 45/1253* (2013.01); *H01L 45/146* (2013.01); *H01L 45/1608* (2013.01)

(58) Field of Classification Search
CPC ....................... G11C 13/0007; G11C 13/0011
USPC ......................................................... 365/100
See application file for complete search history.

(56) References Cited

U.S. PATENT DOCUMENTS

| | | | |
|---|---|---|---|
| 7,499,304 B2 | 3/2009 | Scheuerlein et al. | |
| 7,538,338 B2 * | 5/2009 | Rinerson | G11C 11/5685 257/2 |
| 8,159,857 B2 | 4/2012 | Gammel et al. | |
| 8,675,387 B2 | 3/2014 | Ikeda et al. | |
| 2006/0250837 A1* | 11/2006 | Herner | G11C 11/5685 365/148 |
| 2013/0043452 A1* | 2/2013 | Meyer | H01L 27/101 257/4 |
| 2013/0062587 A1* | 3/2013 | Lee | H01L 45/08 257/4 |
| 2014/0192589 A1* | 7/2014 | Maxwell | H01L 45/12 365/148 |
| 2014/0293678 A1* | 10/2014 | Orlowski | H01L 45/08 365/148 |
| 2015/0129829 A1* | 5/2015 | Kumar | H01L 27/2409 257/5 |

OTHER PUBLICATIONS

Lee et al., "Resistance switching of Al doped ZnO for Non Volatile Memory Applications", 2006, IEEE, Non-Volatile Semiconductor Memory Workshop 2006 NVSMW 2006 21st, pp. 86-87.*
Office Action dated Sep. 22, 2015 for U.S. Appl. No. 14/479,111, 25 pages.

* cited by examiner

*Primary Examiner* — Amir Zarabian
*Assistant Examiner* — Jay Radke
(74) *Attorney, Agent, or Firm* — Amin, Turocy & Watson, LLP

(57) ABSTRACT

Providing for a memory cell capable of forming a one time programmable, multi-level cell two-terminal memory cell or a rewritable, two terminal memory cell is described herein. In some embodiments, one time programmable, multi-level cell two-terminal memory cell can exhibit diode-like characteristics. In other embodiments, the memory cell can comprise a first electrode layer configured to generate ions in response to an electric field applied to the memory cell; a resistive ion migration layer at least in part permeable to migration of the ions within the resistive ion migration layer; a second electrode layer; and a substrate layer comprising a silicon wafer.

22 Claims, 10 Drawing Sheets

MLC OTP OPERATION WITH DIODE BEHAVIOR IN ZNO RRAM DEVICES FOR 3D MEMORY

TECHNICAL FIELD

This application relates generally to a memory cell capable of operating as a one-time programmable multi-level memory cell device with diode behavior or a rewritable memory cell device.

BACKGROUND

The inventors of the present disclosure have been focusing research in the area of resistive memory within the field of integrated circuit technology. While much of resistive memory technology is in the development stage, various technological concepts for resistive memory have been demonstrated by the inventors, and are in one or more stages of verification to prove or disprove associated theory(ies). The inventors believe that resistive memory technology promises to hold substantial advantages over semiconductor transistor-based technologies in the electronics industry.

The semiconductor transistor has been the basis of electronic memory and processing devices for the past several decades. Over time, advancement in technology has roughly followed Moore's Law, which predicts an increase in a number of semiconductor devices, such as transistors, that can be fabricated on a given geometric area of a semiconductor chip. One implication of increasing number of semiconductor devices is increasing memory capacity and processing power for the semiconductor chip and associated electronic devices. Moore's Law has been fairly accurate at predicting the advancement of semiconductor technology up to the present.

The inventors of the disclosed subject matter have worked with two-terminal memory devices, such as resistive memory, as a replacement for three-terminal semiconductor transistors. Based on their experience in the field, mathematical predictions and test results, the inventors believe that two-terminal memory devices can overcome drawbacks of three-terminal semiconductor transistors in various categories related to performance and reliability. Examples include write, erase and access times, data reliability, device density, and others. Accordingly, the inventors are in the process of discovering new ways to create or fabricate two-terminal memory technologies and how they can replace conventional micro electronic systems and devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject disclosure provide for a monolithic stack capable of forming a one-time programmable, multi-level cell memory or a rewritable memory. In some embodiments, the monolithic stack can comprise a first electrode layer, a resistive ion migration layer, a second electrode layer and a substrate layer. In an aspect, the memory cell can form a one-time programmable (OTP) memory device in response to application of a negative bias initial formation signal being a first bias applied to the first electrode layer after fabrication of the memory cell. In another aspect, the memory cell can form a rewritable two-terminal memory cell in response to application of a positive bias initial formation signal being the first bias applied to the first electrode layer after fabrication of the memory cell.

In an embodiment, the first electrode can comprise an Aluminum doped Zinc Oxide (AZO) material. Furthermore, in an aspect, the resistive ion migration layer can be comprised of an intrinsic ZnO material. In another aspect, the second electrode layer can comprise doped silicon (Si) material. In yet another aspect, the substrate layer can comprise a Si material. Also, in an aspect the second electrode layer as well as the resistive ion migration layer can each respectively be about 20~100 nm thick.

In some embodiments, a disclosed method of fabricating a memory cell is provided comprising forming a first electrode layer configured to generate ions in response to an electric field applied to the memory cell, wherein the first electrode layer comprises an Aluminum doped Zinc Oxide (AZO) material; forming a resistive ion migration layer at least in part permeable to migration of the ions within the resistive ion migration layer, wherein the resistive ion migration layer is comprised of an intrinsic ZnO material; forming a second electrode layer, wherein the second electrode layer comprises a doped silicon (Si) material; and forming a substrate layer comprising a silicon wafer.

According to further embodiments, a disclosed electronic device is provided comprising an array of memory cells wherein the array comprises the following elements: a memory cell element comprising a first electrode layer configured to generate ions in response to an electric field applied to the memory cell, a resistive ion migration layer at least in part permeable to migration of the ions within the resistive ion migration layer, a second electrode layer, and a substrate layer comprising a silicon wafer; and a programming element that preprograms the memory cell element to form either a one-time programmable (OTP) memory device in response to application of a negative bias initial formation signal being a first bias applied to the first electrode layer or a rewritable memory device in response to application of a positive bias initial formation signal being the first bias applied to the first electrode layer. In an aspect, the one time programmable (OTP) memory device presents a diode characteristic comprising a rectification ratio ranging from 100× to 1000×.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1A:
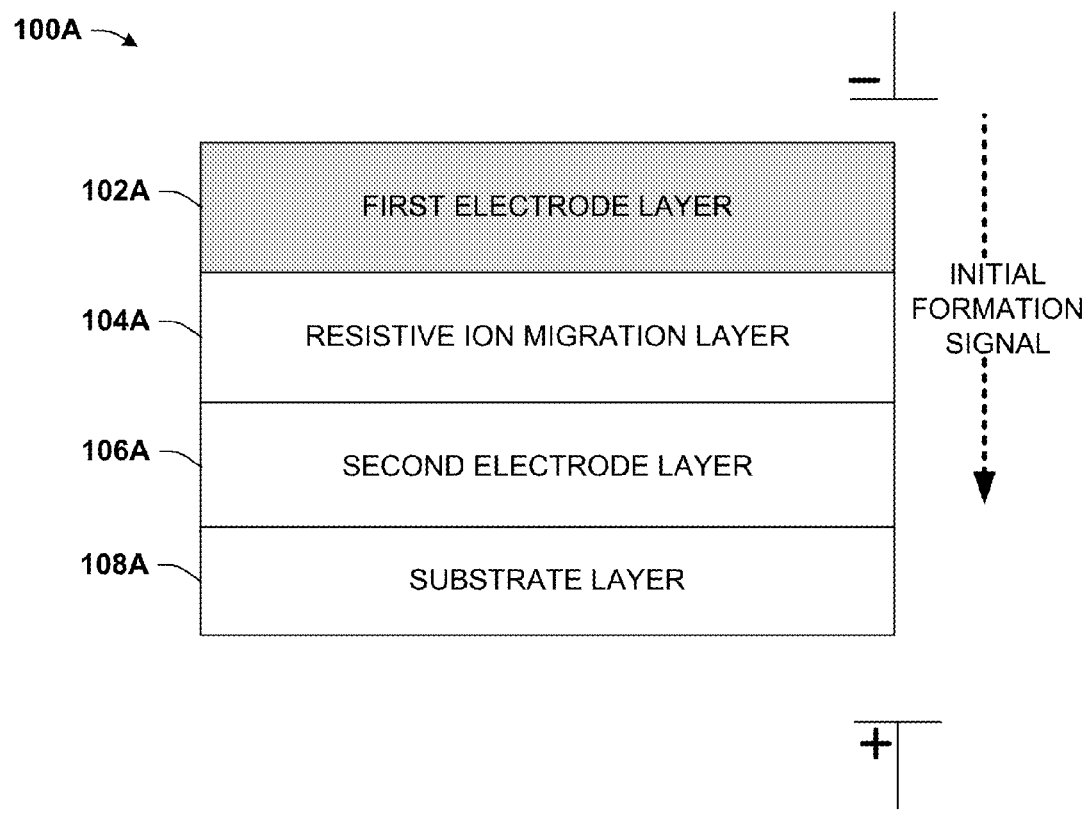
FIGS. 1A and 1B depict block diagrams of example one-time programmable, multi-level memory cells according to embodiments of the disclosure.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a pulse width, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer capable of being ionized or generating ions (e.g., at a boundary of the RSL and the active metal layer). Under suitable conditions, the active metal layer can provide filament-forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g., Zinc Oxide), and so forth. Other examples of materials suitable for the RSL could include $Si_XGe_YO_Z$ (where X, Y and Z are respective suitable positive integers), a silicon oxide (e.g., $SiO_N$, where N is a suitable positive integer), $HfO_C$ (where C is a suitable positive integer), $TiO_D$ (where D is a suitable positive integer), and so forth, or a suitable combination thereof. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. Some details pertaining to embodiments of the subject disclosure similar to the foregoing example(s) can be found in the following U.S. patent applications that are licensed to the assignee of the present application for patent application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the present application are of the opinion that two-terminal memory devices, such as resistive-switching memory devices, have various advantages in the field of electronic memory. For example, resistive-switching technology can generally be small, consuming silicon area on the order of $4F^2$ per adjacent resistive-switching device for a single bit device (e.g., a memory cell comprising two resistive-switching devices would therefore be approximately $8F^2$ if constructed in adjacent silicon space), where F stands for the minimum feature size of a specific technology node. Non-adjacent resistive-switching devices, e.g., stacked above or below each other, can consume as little as $4F^2$ for a set of multiple non-adjacent devices. Moreover, multi-bit devices having two, three or more bits per memory cell can result in even greater densities in terms of bits per silicon area consumed. These advantages can lead to great semiconductor component density and memory density, and low manufacturing costs for a given number of digital storage bits. The inventors also believe that resistive-switching memory can exhibit fast programming speed and low programming current, and smaller cell sizes enabling greater component densities. Other benefits include non-volatility, having the capacity to store data without continuous application of power, and capacity to be built between metal interconnect layers, enabling resistive-switching based devices to be usable for two-dimension as well as three-dimension semiconductor architectures.

To program a filamentary-based resistive-switching memory cell, a suitable program voltage can be applied across the memory cell causing a conductive filament to form through a relatively high electrical resistance portion of the memory cell. This causes the memory cell to change from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing the binary information.

Further to the above, a multi-level resistive-switching memory cell can store one of multiple bits of digital information. The inventors of the subject application believe that multiple bit storage can be accomplished, in the context of resistive-switching media for instance, in response to multiple filament states (modulation of the width or length of a filament) that exhibit distinct electrical characteristics. For instance, a first filament state can exhibit a first electrical characteristic (e.g., a first current value, a first resistance value, a first voltage value, etc.), a second filament state can exhibit a second electrical characteristic measurably distinct from the first electrical characteristic, and so on. According to various digital information models, the number of filament states can be related to the number of digital bits that can be stored by the resistive switching device. In one example digital information model, the number of digital bits Y can be related to the number of filament states X by the following relationship:

$$X=2^Y.$$

According to this relationship, a memory cell capable of storing two digital bits can be achieved with four distinct filament states, a memory cell capable of storing three digital bits can be achieved with eight distinct filament states, and so on.

Figure 1B:
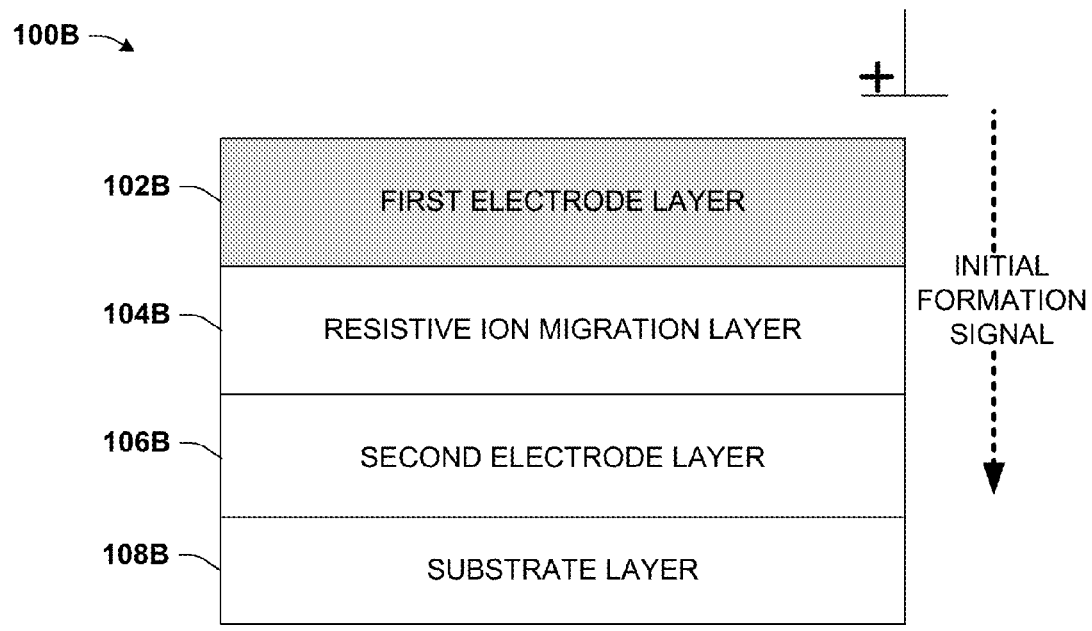

Referring now to the drawings, FIGS. 1A and 1B illustrate respective block diagrams of example memory cell 100A, 100B according to various embodiments of the subject disclosure. Referring first to FIG. 1A, memory cell 100A is depicted wherein the memory cell comprising a monolithic stack is capable of forming a multi-level cell (MLC) one-time programmable (OTP) device or a rewritable two-terminal memory cell device. In an aspect, memory cell 100A can comprise a first electrode layer 102A configured to generate ions in response to an electric field applied to the memory cell adjacent to a resistive ion migration layer 104A at least in part permeable to migration of the oxygen ions within the resistive ion migration layer. The ion migration layer 104A can also be adjacent to a second electrode layer 106A formed adjacent to a substrate layer 108A comprising a semiconductor substrate, e.g. a silicon wafer having one or more CMOS devices formed therein. Memory cell 100A as a monolithic stack is versatile wherein the application of either a negative or positive initial formation signal to memory cell 100A can pre-form the monolithic stack into either a one-time programmable (OTP) memory device or a rewritable two-terminal memory cell device.

In an aspect, memory cell 100A can form a one-time programmable (OTP) memory device or exhibit OTP memory characteristics in response to application of a negative bias initial formation signal being a first bias applied to the first electrode layer 102A after fabrication of the memory cell. For instance, memory cell 100A can store one of multiple bits of digital information (a multi-level cell), and can be configured to mitigate or avoid erasure of information stored by memory cell 100A (one-time programmable). Multi-level data storage can correspond to memory cell 100A offering greater memory density (in terms of bits per silicon space) as compared to single bit memory devices. In addition, the OTP characteristic can make this high memory density device suitable for write once, read many (WORM) memory devices. Such devices can be useful for ROM applications, where an electronic device provider desires to write configuration instructions, boot-time instructions, and so forth at time of manufacture of the electronic device, which can be read by the electronic device or applications thereof during normal operation (e.g., operation that does not induce catastrophic failure of memory cell 100A), but not erased during normal operation. In various embodiments, memory cell 100A can comprise a two-terminal MLC OTP memory cell, having high memory density, very fast read times, high data retention, high data longevity, and other benefits believed by the inventors to be achievable with two-terminal memory cells.

As depicted, memory cell 100A can comprise a first electrode layer 102A adjacent to a resistive ion migration layer 104A and a second electrode layer 106A adjacent to resistive ion migration layer 104A. In an aspect, the resistive migration layer 104A and second electrode layer can each respectively comprise a thickness of about 20~100 nm. Resistive ion migration layer 104A can be formed of a material having high electrical resistance (e.g., compared with electrode layer 102A). In addition, resistive ion migration layer 104A can be permeable or partly permeable to ions of first electrode layer 102A. Suitable materials for first electrode layer can include an Aluminum doped Zinc Oxide (AZO) material. In an aspect, suitable materials for resistive ion migration layer can include an intrinsic Zinc Oxide (ZnO) material. In another aspect, suitable materials for second electrode layer can include, for instance, a doped Silicon (Si) bearing material such as a p-type poly Si material or a p-type silicon germanium (SiGe) material. Wherein, second electrode layer is a Boron-doped Si material, the material can comprise about 1E15~1E20 atoms/cm$^3$ of Boron. In an aspect, suitable material for the substrate layer 108A can include a wafer comprising a Si material.

In some embodiments, first electrode layer 102A comprises a metal material that produces free ions at the interface of resistive ion migration layer 104A and first electrode layer 102A in response to an applied electric field. In some embodiments, top electrode 102 is an elemental metal and is not an ionically bonded material. First electrode layer 102A can also include additional layers (some very thin, e.g., 2 to 3 nm), such as Ti, TiN, W, or the like, above first electrode layer 102A, or between first electrode layer 102A and resistive ion migration layer 104A, or the like. In still other embodiments, one or more other layers can be included in memory cell 100A. For instance, an intermediary layer(s)

can be instituted adjacent to one or more of the layers depicted in FIG. 1. As one example, a suitable material layer that mitigates or controls unintended oxidation of resistive ion migration layer 104A can be positioned between one or more layers of memory cell 100A, such as between first electrode layer 102A and ion migration layer 104A. As another example, in some embodiments, memory cell 100A can have fewer layers than depicted in FIG. 1. For instance, first electrode layer 102A or second electrode layer 106A can be removed, and resistive ion migration layer 104A can electrically contact a conductive bitline or wordline of a memory array. Accordingly, it is to be appreciated that suitable variations of memory cell 100A known in the art or made known to one of ordinary skill in the art by way of the context provided herein are considered within the scope of the present disclosure.

Referring now to FIG. 1B, illustrated is an example memory cell 100B according to additional aspects of the subject disclosure. Memory cell 100B, similar to memory cell 100A, comprises a first electrode layer 102B configured to generate ions in response to an electric field applied to the memory cell adjacent to a resistive ion migration layer 104B at least in part permeable to migration of the ions within the resistive ion migration layer. The ion migration layer 104B can also be adjacent to a second electrode layer 106B. In at least one embodiment, a bottom layer of memory cell 100B or memory cell 100A can be formed above a substrate layer 108A or substrate layer 108B of a semiconductor device (e.g., on a suitable Silicon semiconductor material, a suitable Silicon compound, or the like). Memory cell 100B as a monolithic stack is versatile wherein the application of either a negative or positive initial formation signal to memory cell 100A can pre-form the monolithic stack into either a one-time programmable (OTP) memory device or a rewritable two-terminal memory cell device.

In an aspect, a positive initial formation signal can be applied to first electrode layer 102B. As such, the positive initial formation signal configures the monolithic memory cell 100B to perform rewritable two-terminal memory cell tasks. For instance, a positive voltage can be applied to a bare monolithic memory cell 100B thus pre-forming the memory cell 100B as a rewritable two-terminal memory cell device. Furthermore, in an aspect, the rewritable two-terminal memory cell device can exhibit a first switching response (e.g., programming), and a second switching response (e.g., erasing) in response to the application of electrical signals having the same polarity and different magnitudes. Thus, in an instance, applying a positive voltage electrical signal to first electrode 102B can program the rewritable two-terminal memory cell device. Subsequently, by applying a negative voltage of a large magnitude to first electrode layer 102B the written program of the rewritable two-terminal memory cell can be erased.

In one or more embodiments of the subject disclosure, memory cell 100A or memory cell 100B can be arranged in one or more memory array configurations. In some embodiments, memory cell 100A or memory cell 100B can be disposed in a two-dimensional array, in which a plurality of memory cells 100A, 100B are arranged into a plurality of rows and columns of such memory cells. In other embodiments, memory cell 100A or memory cell 100B can be disposed in a stacked array, in which multiple memory cells 100A, 100B are stacked one above another, yet individually selectable or addressable. In the latter embodiments, memory cells 100A, 100B can be formed with a low temperature process (e.g., a low temperature deposition process) so that sequential formation of memory cells above or below other memory cells has little or no operational impact on these previously formed, other memory cells. In at least one embodiment, memory cells 100A, 100B can be disposed in a three-dimensional arrangement, comprising a plurality of two-dimensional arrays (respectively comprising columns and rows of memory cells 100A, 100B) stacked into a third dimension, for instance by iterative low temperature deposition processes creating respective ones of the two-dimensional arrays in the third dimension.

Figure 2A:
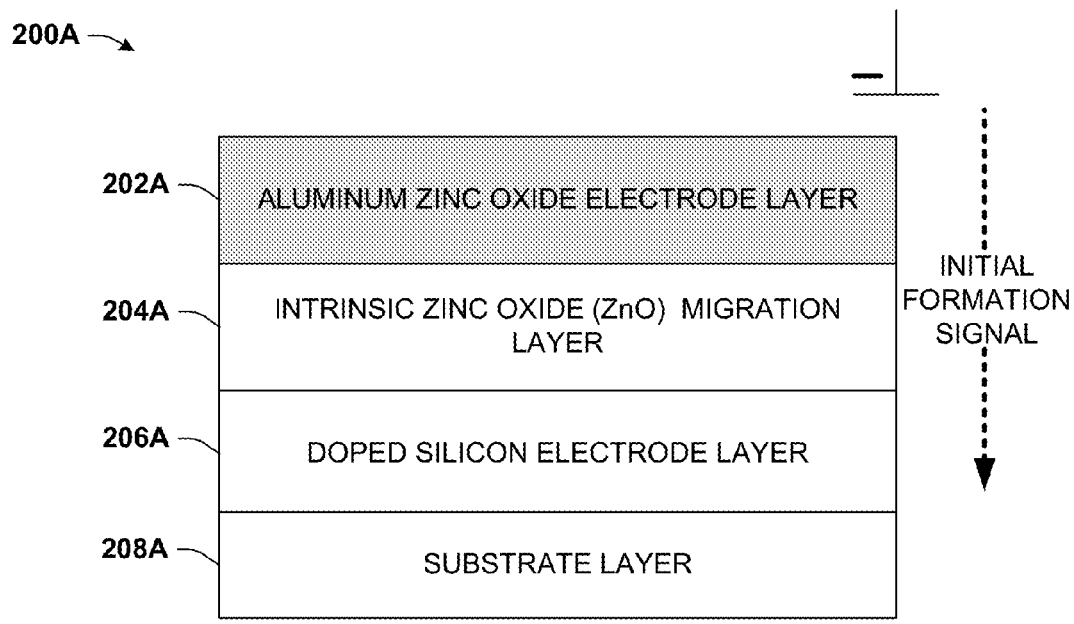
FIGS. 2A and 2B depict a sample diagram of memory cells in response to a negative initial formation signal and positive initial formation signal respectively.
Figure 2B:
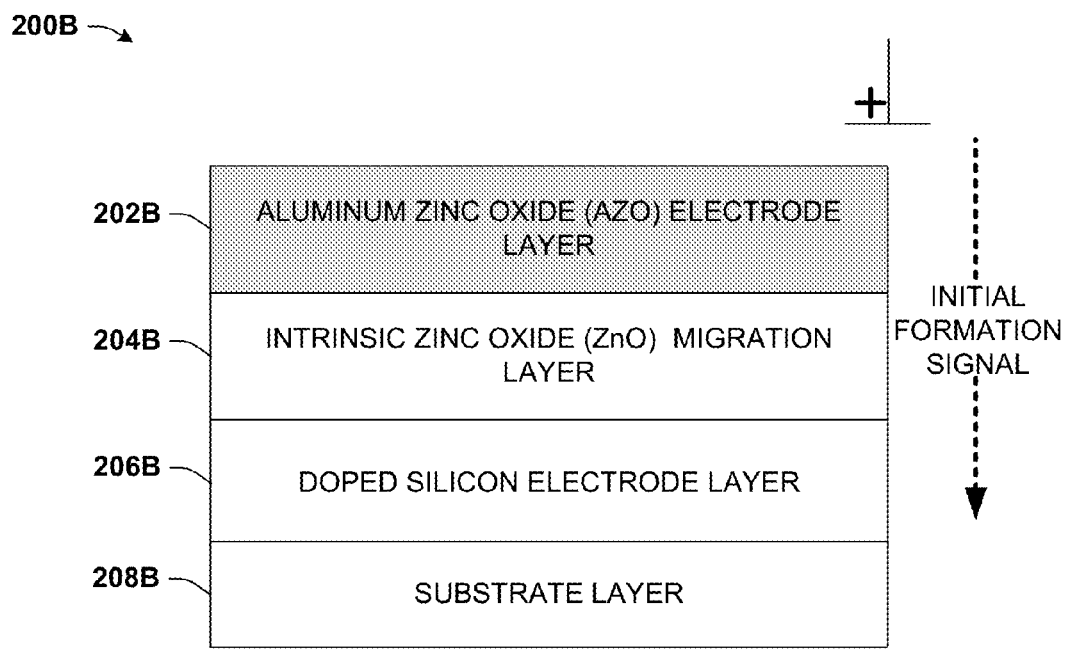

FIGS. 2A and 2B illustrates a block diagram of example memory cells 200A and 200B according to additional aspects of the subject disclosure. Memory cell 200A is configured as a one-time programmable multi-level memory cell and memory cell 200B is configured as a rewritable, two terminal memory cell whereby both memory cell 200A and 200B are operable (e.g., programmable, programmable to one of a set of logical bits, and so forth) in response to a suitable program signal(s) applied across the two terminals. Memory cell 200A is a one-time programmable multi-level cell (MLC OTP) as a result of the application of a negative voltage initial formation signal applied to aluminum doped zinc oxide electrode layer 202A. Memory cell 200B is a rewritable, two terminal memory cell as a result of the application of a positive voltage initial formation signal applied to aluminum doped zinc oxide electrode layer 202B. After formation of the monolithic stack of memory cell 200A or 200B, the memory cell is "set" as either a MLC OTP device or rewritable, two terminal memory cell device by applying either a negative or positive initial formation signal to electrode layer 202A or 202B respectively. Thus, subsequent to memory cell formation and prior to application of initial formation signal both memory cell 200A and 200B can be set as either a MLC OTP device or a rewritable, two terminal memory cell device.

As depicted in FIGS. 2A and 2B, memory cell 200A and 200B can comprise an Aluminum doped Zinc Oxide (AZO) electrode layer 202A or 202B. Aluminum doped Zinc Oxide (AZO) electrode layer 202A or 202B can serve as a first of the two terminals of memory cell 200A or 200B. In one example, Aluminum doped Zinc Oxide (AZO) electrode layer 202 can serve as a top electrode for memory cell 200 (e.g., connected to a bitline of a memory device), whereas doped silicon can serve as a bottom electrode for memory cell 200 (e.g., connected to a dataline, a wordline, a semiconductor substrate, or the like, as suitable for a desired memory architecture).

Adjacent to Aluminum doped Zinc Oxide electrode layer 202A or 202B, memory cell 200 can comprise an intrinsic zinc oxide migration layer 204A or 202B. Intrinsic zinc oxide migration layer 204A or 204B can comprise a suitable high resistance material within which aluminum ions can move in response to an electromotive force. Particularly, the material can facilitate mobility of the aluminum ions without a breakdown of the high resistance material. Accordingly, permeation of aluminum ions within intrinsic zinc oxide migration layer 204A or 204B can be relatively controllable in response to a suitable signal. Thus, a suitable program signal applied to memory cell 200A or 200B can form a conductive filament of aluminum ions within intrinsic zinc oxide migration layer 204A or 204B, having a selected filament state of a set of filament states. This can facilitate MLC programming, as described herein.

Further to the above, memory cell 200A or 200B can comprise a doped silicon electrode layer 206 adjacent to a substrate layer 208A or 208B. The combination of AZO electrode layer 202A or 202B, intrinsic ZnO migration layer 204A or 204B, and doped Si electrode layer 206A or 206B form the switching stack of monolithic memory cell 200A or 200B respectively. In some embodiments electrode layer 206A or 206B can be comprised of Indium Tin Oxide (ITO) rather than doped silicon. In other embodiments, electrode layer 206A or 206B can be comprised of Silver (Ag). In any such embodiment, the switching stack remains versatile in that after formation of the memory cell, the embodied memory cell can be set as either an MLC OTP device or rewritable, two terminal device by application of an initial formation signal to AZO electrode layer 202A or 202B.

In an aspect, the disclosed memory cell embodiments can be organized into an array of such memory cells 200A or 200B to form a two-dimensional memory array. In a further embodiment, multiple two-dimensions arrays of memory cells 200A or 200B can be stacked in a third dimension, to facilitate a three dimensional array of memory cells 200A or 200B. This can serve to provide very high memory densities for solid state memory applications, coupled with a high read speed anticipated by the inventors for the resistive-switching two-terminal memory cell structure of memory cell 200A and 200B. For instance, memory cell 200A can be stacked in a two dimensional array with another memory cell 200A. Furthermore, in an aspect, memory cell 200A can be stacked in a three dimensional array with a memory cell 200B, and another memory cell 200B. Several, permutations and combinations of memory cell array stacking are possible to further enhance the densities of the memory cells.

Memory cell 200A or 200B comprises a resistive ion migration layer 204 that is at least in part permeable to ions of AZO electrode layer 202A or 202B. Accordingly, ions can migrate into ZnO migration layer 204A or 204B without breaking bonds, in a conductive filament formation process that can be controlled. For example, the process can be controlled by selected a predetermined set of signal characteristics of a program signal utilized to form the conductive filament. The predetermined set of signal characteristics can include, for instance, a selected current magnitude, a selected program voltage, a selected program pulse width, or the like, or a suitable combination thereof. This allows for predictability in creating a conductive filament having a selected one of a set of filament states, and therefore a selected one of a set of MLC logical bits.

In operation, a suitable program signal having one of a set of signal characteristics can be applied to memory cell 200A or 200B. This program signal results in formation of a conductive filament having a selected one of a set of filament states. This migration of ions can reduce electrical characteristics of ZnO migration layer 204A or 204B and memory 200 (e.g., resistance, conductivity, etc.) in a measurable and predetermined manner. Accordingly, memory cell 200A or 200B can be reliably programmed to one of a set of MLC logical bits, represented by the one of the set of filament states.

In addition to the foregoing, doped Si electrode layer 206A can have a reverse bias polarity opposite a polarity of a suitable program signal for memory cell 200A. Because of the ion permeability of resistive ZnO migration layer 204A, a reverse bias polarity could ordinarily cause ions to migrate toward doped Si electrode layer 206A, increasing electrical resistance of resistive ZnO migration layer 204A. To mitigate or prevent deformation of a conductive filament formed within ZnO migration layer 204A, doped Si electrode layer 206A can have a reverse bias breakdown voltage that is greater in magnitude than an erase voltage suitable to deform the conductive filament. In addition, doped Si electrode layer 206A can have a reverse bias current much smaller than that suitable for deforming the conductive filament. Accordingly, a reverse bias voltage applied to memory cell 200A will drop in greatest part doped silicon electrode layer 206A avoiding a suitable erase voltage magnitude from occurring at ZnO migration layer 204A in response to the reverse bias voltage. Accordingly, memory cell 200A can operate as an OTP memory cell, allowing selective programming of one of a set of MLC logical bits (e.g., based on a suitable set of program signal characteristics), while mitigating or preventing erasure of the programming.

Figure 3:
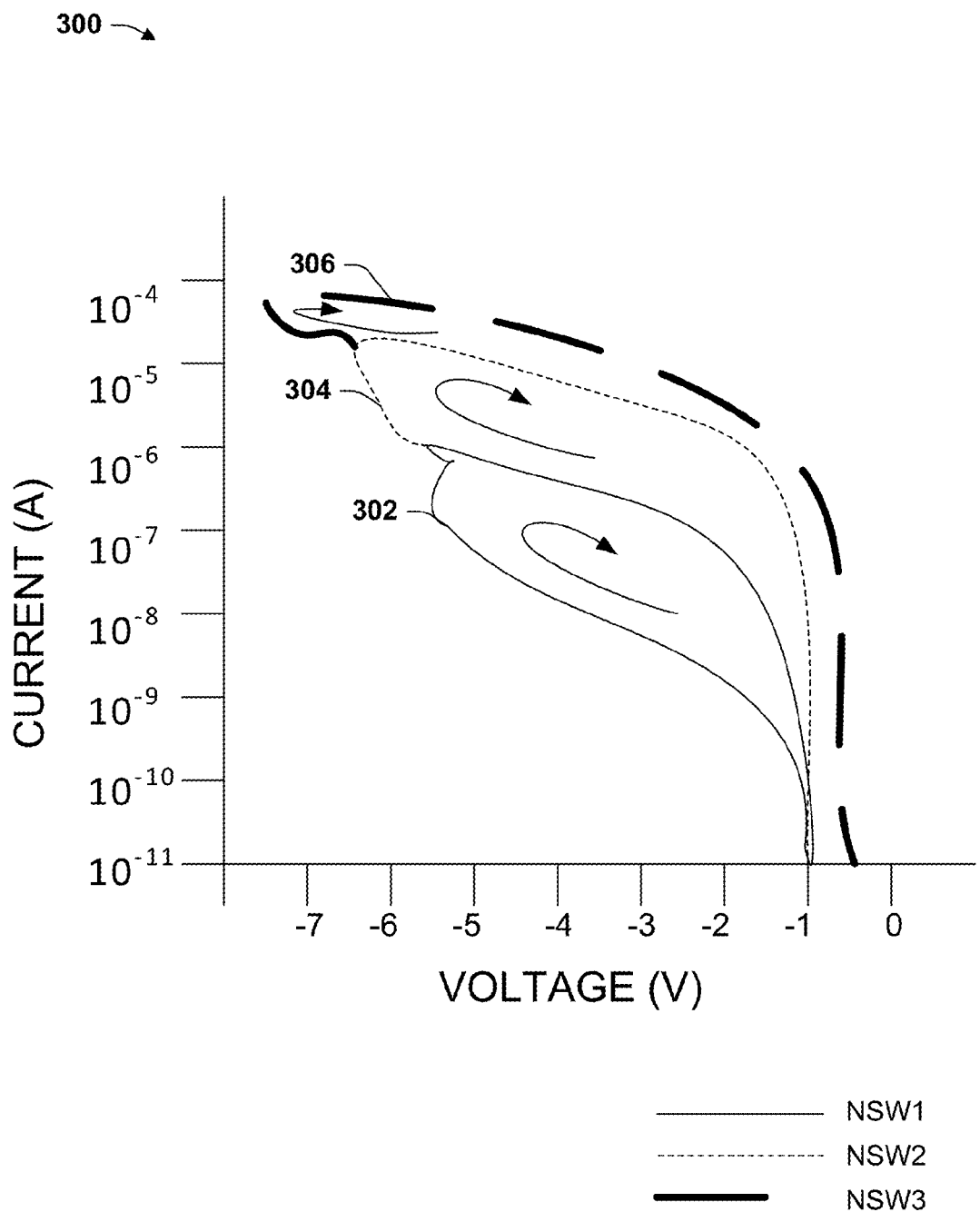
FIG. 3 illustrates a graph depiction of a MLC OTP device and various response levels in response to application of negative voltages.

FIG. 3 is a chart that depicts the creation of multiple response levels in accordance with the application of various magnitudes of negative voltage to a memory cell 200A which is a OTP MLC device (e.g., a negative initial formation signal was applied to AZO electrode layer 202A. To program a MLC OTP memory cell, a suitable program voltage can be applied across the memory cell causing a conductive filament to form through a relatively high electrical resistance portion of the memory cell. This causes the memory cell to change from a relatively high resistive state, to a relatively low resistive state. In an aspect, first response 302, second response 304, and third response 306 respectively represent various conductive states in response to respective program signals applied to AZO electrode layer 202A. Each program signal can have a set of signal characteristics such as a current magnitude, voltage magnitude, program signal pulse width, or the like, or a suitable combination thereof, configured to produce a conductive filament having a conductive state.

In an aspect, each conductive state, can cause ZnO migration layer 204A to have a set of measurable and distinct electrical characteristics. Furthermore, each change of state, in the context of memory, can be associated with respective states of a binary bit. Referring to FIG. 3, negative voltages are listed on the x-axis and on the y-axis various current magnitudes are listed. In an aspect, respective negative voltage magnitudes are applied to AZO electrode layer 202A and are referred to as negative sweeps (e.g., NSW 1, NSW2, NSW3, etc.). In FIG. 3, the line curves depict increases in current conductance of memory cell 200A in accordance with application of a negative voltage applied to AZO electrode layer 202A. In an aspect, first response 302 results from application of approximately between −5 Volts (V) and −5.5 V, wherein memory cell 200A conducts a current of between $10^{-6}$ Amperes (A) and $10^{-7}$ A. Furthermore, in an aspect, second response 304 results from application of approximately between −5.5 V and −6.0 V, wherein memory cell 200A conducts a current of between $10^{-5}$ A and $10^{-6}$ A. In another aspect, third response 306 results from application of approximately between −6.0 V and −7.0 V, wherein memory cell 200A conducts a current of $10^{-4}$ A and below.

As increased negative sweeps are applied to AZO electrode layer 200A respective conductance responses result. More responses can be achieved by lowering the intervals of applied voltages to AZO electrode layer 200A. For instance, four response levels can be achieved by applying four negative voltage sweeps to AZO electrode layer 200A each voltage sweep having a range of voltage increases sometimes referred to as steps (e.g. a first negative sweep between −5V and −5.5V, a second negative sweep between −5.5V and −6.0V, a third negative sweep between −6.0V and −6.5V, and a fourth negative sweep above −6.5V). The increase in steps of a voltage sweep can occur on smaller magnitudes to increase the number of response levels resultant in memory cell 200A or on larger magnitudes to decrease the number of response levels resultant in memory cell 200A. The presence of four response levels (e.g., in response to four negative sweeps applied to AZO electrode layer 202A) can enable memory cell 200A to store 2 bits of information (e.g., 00, 01, 10, 11). As discussed, memory cell device 200A is an MLC OTP and thus cannot be erased after application of a negative initial formation signal to AZO electrode layer 202A. Furthermore, upon application of one or more negative sweep to AZO electrode layer 202A, the memory cell 200A presents diode-like characteristics.

Figure 4:
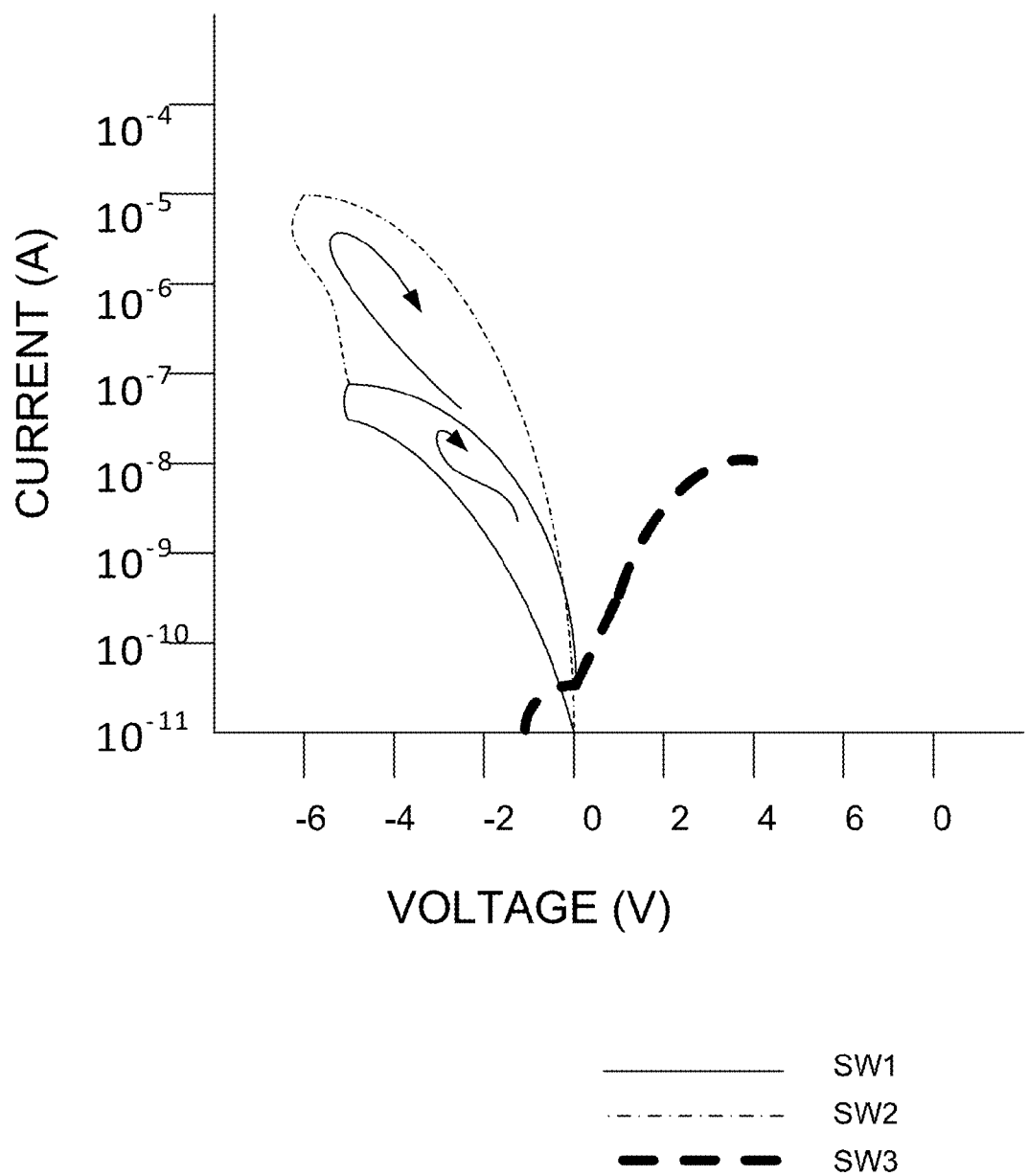
FIG. 4 illustrates a graph depiction of a diode behavior observed to occur from a MLC OTP device.

Referring to FIG. 4, a graph is depicted illustrating the presence of diode-like characteristics upon the application of one or more negative sweep to AZO electrode layer 202A. Thus, MLC OTP as disclosed herein presents MLC OTP characteristics (e.g. programmable, non-erasable) and diode characteristics in the absence of having a separate diode component in series with memory cell 200A. In an aspect, the line graph depicts rectifying characteristics wherein the application of one or more negative sweep to memory cell 200A (e.g., an OTP MLC device) conducts current when written (e.g., programmed) with a negative bias (e.g. application of a negative voltage) and conducts current when written (e.g. programmed) with a positive bias (e.g. application of a positive voltage). In an aspect, memory cell 200A acts as a diode to conduct current in one direction (e.g., a negative direction) while suppressing current in another direction (e.g., a positive direction). For example, in FIG. 4, the current produced at application of −2V is 100 nanoAmpere (nA) and the current produced at 2V is 1 nA. Thus a rectification ratio of 100× to 1000× can be observed in memory cell 200A. Furthermore, the presence of diode like properties provides opportunity for three dimensional OTP stacking.

The intrinsic presence of diode characteristics in memory cell 200A presents advantages such as simplifying the process complexity of developing a diode separately from development of a switching material (e.g. memory cell 200A). In the absence of separately developing a diode and a MLC OTP device, the disclosed stack (e.g. memory cell 200A) presenting diode characteristics is smaller, shorter, and easily integrated into devices. Thus by having a memory cell with intrinsic diode characteristics a manufacturer can avoid the need to place a separate diode in series with the memory cell and can therefore avoid many of the process complexities involved in creating a single memory cell in series with a diode.

Figure 5:
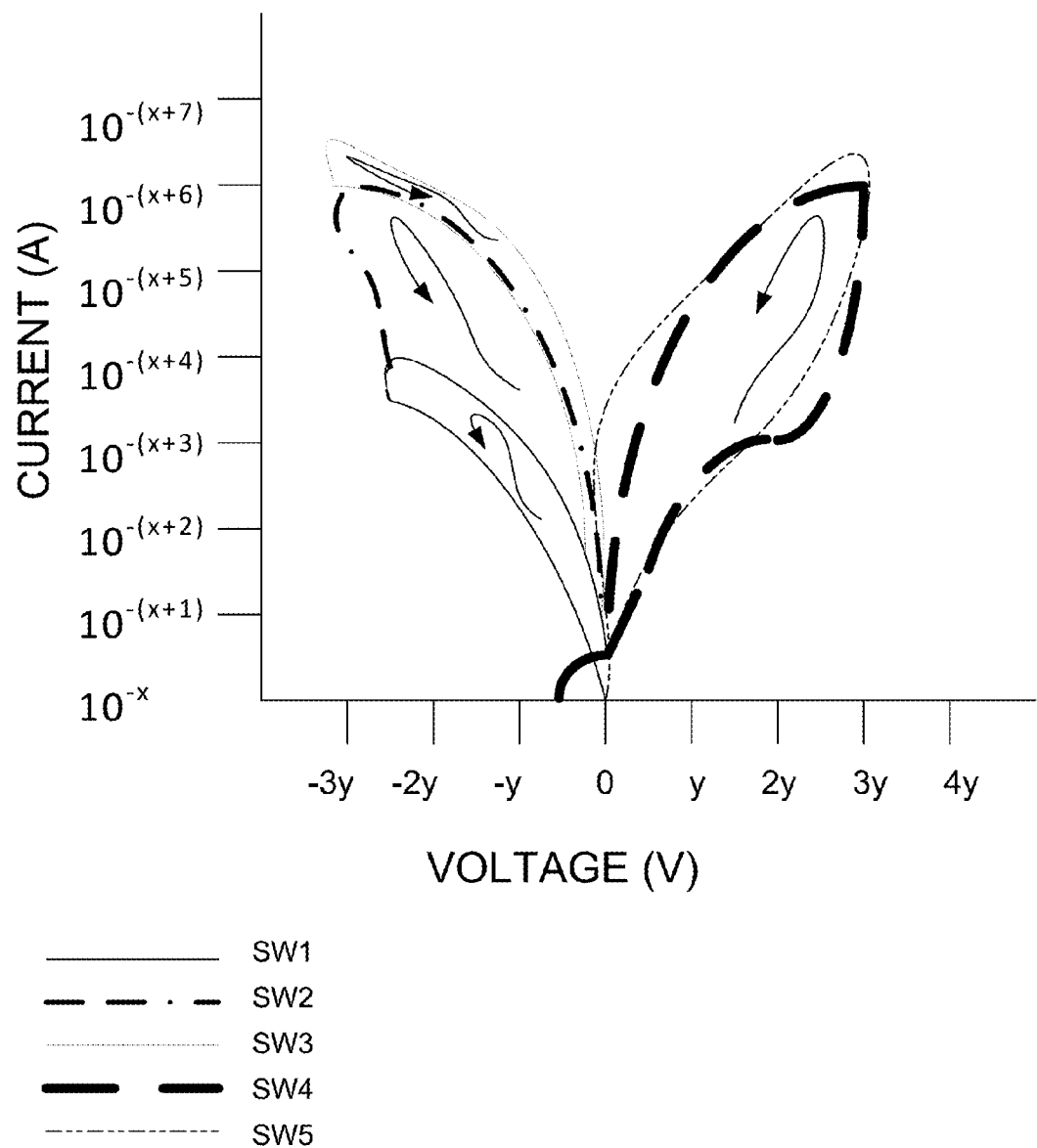
FIG. 5 illustrates a graph depiction of response levels observed after application of positive and negative voltages to a re-writable, two terminal memory cell device.

FIG. 5 illustrates resistance levels upon the application of positive voltages to AZO electrode layer 202B. Memory cell 200B is a rewritable, two terminal memory cell as a result of the application of a positive voltage initial formation signal applied to aluminum doped zinc oxide electrode layer 202B. FIG. 5 illustrates a graph of various response levels resulting from the application of positive voltage magnitudes applied to AZO electrode layer 202B. Furthermore, illustrated are various resistance levels subsequent to erasing a written (e.g., programmed) memory cell 200B. The memory cell 200B is erased by applying a negative voltage to AZO electrode layer 202B subsequent to the application of a positive voltage to AZO electrode layer 200B. In an aspect, merely applying small negative voltage magnitudes (e.g., −2.5V) to AZO electrode layer 202B can erase memory cell 200B subsequent to programming of memory cell 200B by applying a positive voltage to AZO electrode layer 202B. However, if larger negative voltage magnitudes (e.g. −5V) are applied to AZO electrode layer 202B subsequent to programming memory cell 200B, then the memory cell is programmed as an OTP memory cell 200B, thus erasure no longer occurs. Furthermore, in the event an OTP memory cell does not result, memory cell 200B can be rewritten by applying a positive voltage (subsequent to erasure of memory cell 200B) to AZO electrode layer 202B subsequent the application of the negative voltage application.

For instance, in FIG. 5, a positive voltage sweep (e.g. illustrated as SW1) of +6V is applied to AZO electrode layer 202B and provides a first response level (e.g. programming or writing to the memory cell) provided a current resistance between $10^{-5}$ A and $10^{-6}$ A. Subsequently, a negative voltage sweep (e.g., illustrated as SW2) of −2.5V is applied to AZO electrode layer 202B and erases the written memory cell 200B as illustrated by a second response level. Following the erasing, another positive voltage sweep of +6V (e.g., illustrated as SW3) is applied to AZO electrode layer 202B and provides a third response level (e.g. programming or re-writing to the memory cell) provided a current resistance between $10^{-5}$ A and $10^{-6}$ A. Upon each writing (e.g., with a positive voltage sweep), the conductance of memory cell 200B increases and therefore can be written.

The aforementioned diagrams have been described with respect to interaction between several components of a memory cell, memory arrays, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a deposition process can comprise a fill or etching process, an anneal process, or the like, or vice versa, to facilitate deposition, filling or etching of memory cell layers by way of an aggregate process. Components of the disclosed architectures can also interact with one or more other components not specifically described herein but known by those of skill in the art.

In view of the exemplary diagrams described supra, a process method that can be implemented in accordance with the disclosed subject matter will be better appreciated with reference to the flow charts of FIGS. 6-9. While for purposes of simplicity of explanation, the methods of FIGS. 6-9 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the method described herein. Additionally, it should be further appreciated that the method is capable of being stored on an article of manufacture to facilitate transporting and transferring such method to an electronic device. The term article of manufacture, as used, is intended to encompass a computer program accessible from any suitable computer-readable device, device in conjunction with a carrier, storage medium, or the like, or a suitable combination thereof.

Figure 6:
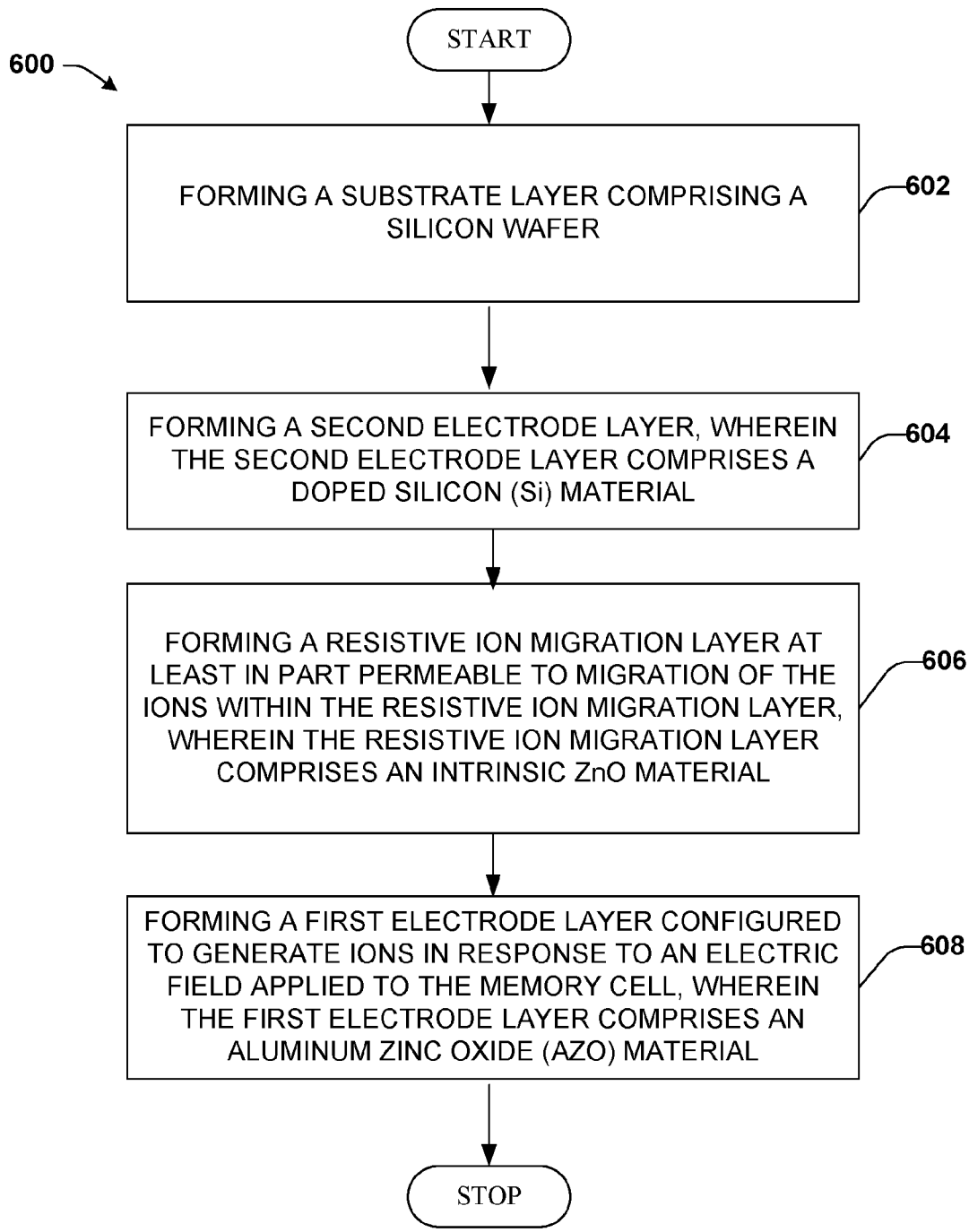
FIG. 6 illustrates a flowchart of a sample method for fabricating a memory cell, according to an embodiment(s).

FIG. 6 illustrates a flowchart of a sample method 600 for fabricating a memory cell according to additional embodiments of the subject disclosure. At 602, method 600 can comprise receiving a semiconductor substrate (e.g. a silicon wafer) having CMOS devices formed thereon. At 604, method 600 can comprise forming a second electrode layer, wherein the second electrode layer can comprise a doped silicon (Si) material. At 606, method 600 can comprise forming a resistive ion migration layer at least in part permeable to migration of the ions within the resistive ion migration layer, wherein the resistive ion migration layer can be comprised of an intrinsic ZnO material. At 608, method 600 can comprise forming a first electrode layer configured to generate ions in response to an electric field applied to the memory cell, wherein the first electrode layer can comprise an Aluminum doped Zinc Oxide (AZO) material.

According to this configuration, the memory cell can be preprogrammed to form a one-time programmable (OTP) memory device in response to application of a negative bias initial formation signal being a first bias applied to the first electrode layer after fabrication of the memory cell, if the negative bias signal is larger than −4V in magnitude for an about 100 nm thick resistive layer. Furthermore, according to this configuration, the memory cell can be preprogrammed to form a rewritable two terminal memory cell device in response to application of a positive bias initial formation signal being a first bias applied to the first electrode layer after fabrication of the memory cell. In ant least one embodiment the memory cell can generate at least one response based on a voltage range of negative bias or positive bias applied to the first electrode layer.

Figure 7:
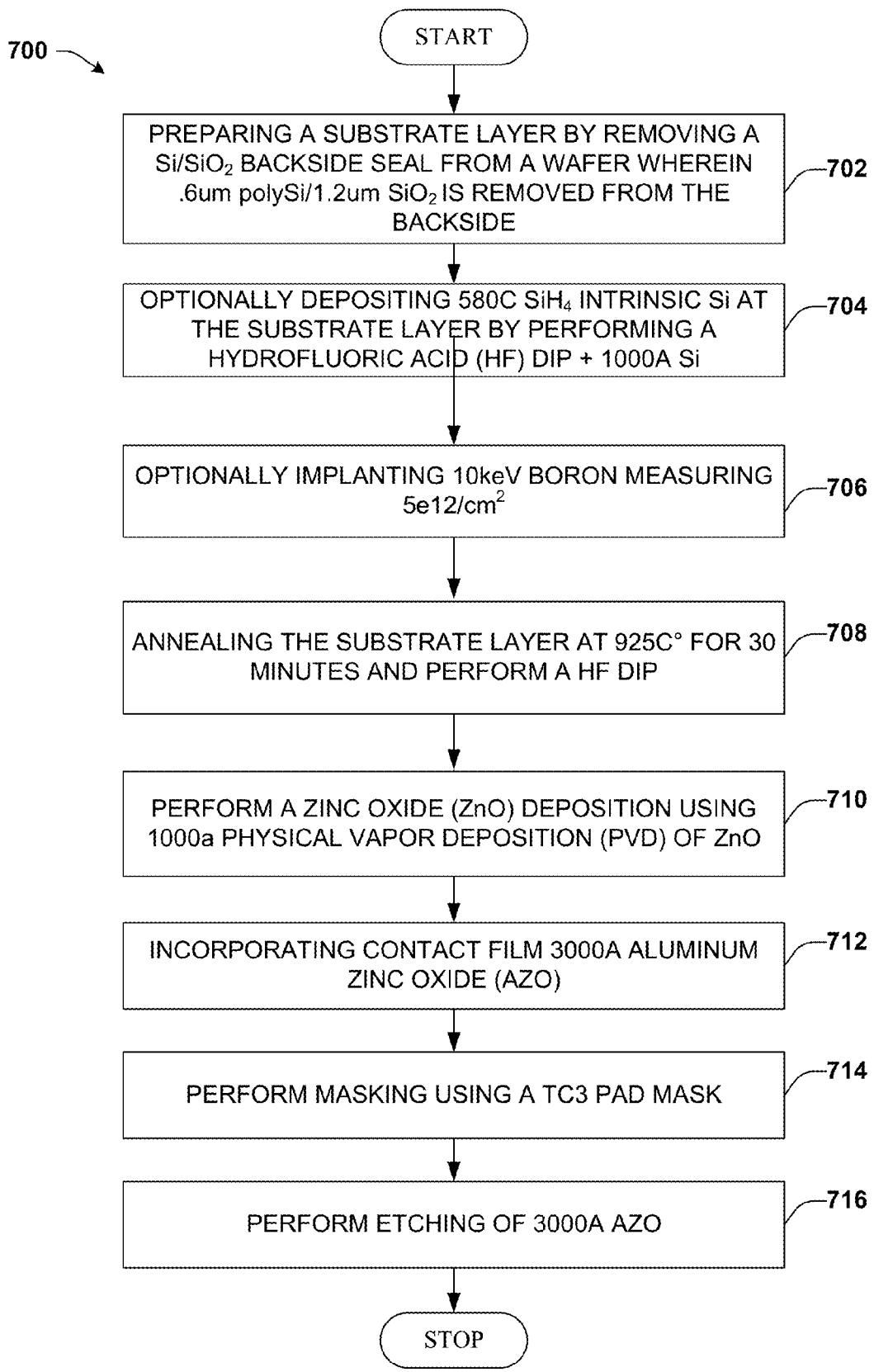
FIG. 7 illustrates a flowchart of a sample method for fabricating a memory cell, according to an embodiment(s).

FIG. 7 illustrates a flowchart of a sample method 700 for fabricating a memory cell according to additional embodiments of the subject disclosure. At 702, method 700 can comprise preparing a substrate layer by removing a Si/SiO$_2$ backside seal from a wafer wherein 0.6 um polySi/1.2 um SiO$_2$ is removed from the backside. At 704, method 700 can comprise depositing 580C SiH$_4$ intrinsic Si at the substrate layer by performing a hydrofluoric acid (HF) dip+1000 A Si. At 706, method 700 can comprise implanting 10 keV Boron measuring 5e12/cm$^2$. At 708, method 700 can comprise annealing the substrate layer at 925° C. for 30 minutes and perform a HF dip. At 710, method 700 can comprise performing a zinc oxide (ZnO) deposition using 1000 A physical vapor deposition (PVD) of ZnO. At 712, method 700 can comprise incorporating contact film 3000 A Aluminum Zinc Oxide (AZO). At 714, method 700 can comprise performing masking using a TC3 pad mask. At 716, method 700 can comprise performing etching of 3000 A AZO.

Figure 8:
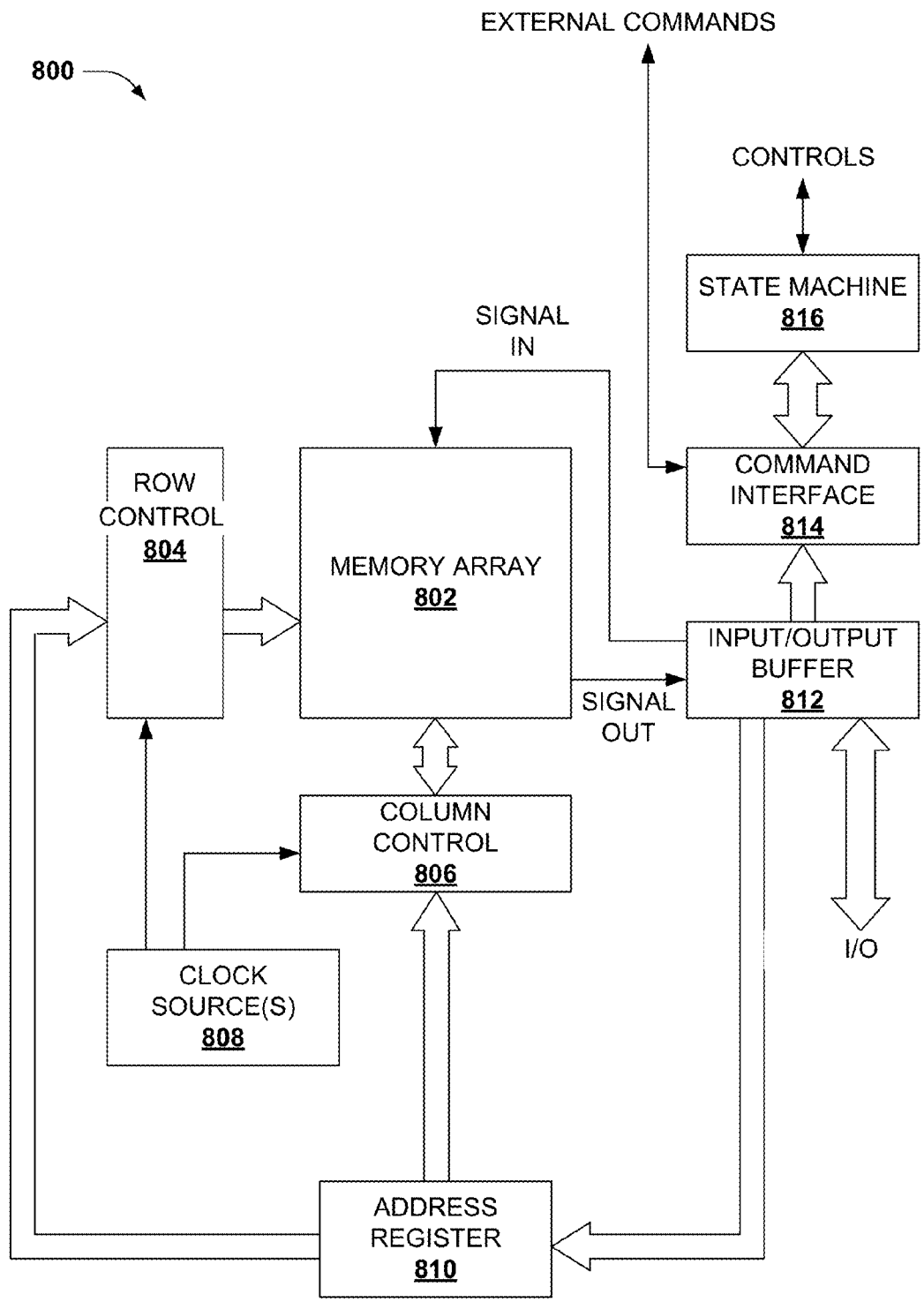
FIG. 8 depicts a block diagram of a sample operating environment for facilitating implementation of one or more disclosed embodiments.

In order to provide a context for the various aspects of the disclosed subject matter, FIG. 8, as well as the following discussion, is intended to provide a brief, general description of a suitable environment in which various aspects of the disclosed subject matter can be implemented or processed. While the subject matter has been described above in the general context of semiconductor architectures and process methods for fabricating or operating such architectures, those skilled in the art will recognize that the subject disclosure also can be implemented in combination with other architectures or process methods. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing (See, e.g., FIGS. 8 and 9, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Such considerations have been addressed by the disclosed aspects.

FIG. 8 illustrates a block diagram of an example operating and control environment 1000 for a memory cell array 802 according to aspects of the subject disclosure. In at least one aspect of the subject disclosure, memory cell array 802 can comprise a variety of memory cell technology. Particularly, memory cell array 802 can comprise two-terminal memory such as resistive-switching memory cells. In various embodiments, memory cell array 802 can be a NAND array comprising two-terminal memory. In at least one embodiment, memory cell array 802 can be a NAND array having respective memory cells that comprise a 1T-1D parallel circuit, as described herein.

A column controller 806 can be formed adjacent to memory cell array 1002. Moreover, column controller 806 can be electrically coupled with bit lines of memory cell array 802. Column controller 806 can control respective bitlines, applying suitable program, erase or read voltages to selected bitlines.

In addition, operating and control environment 800 can comprise a row controller 804. Row controller 804 can be formed adjacent to column controller 806, and electrically connected with word lines of memory cell array 802. Row controller 804 can select particular rows of memory cells with a suitable selection voltage. Moreover, row controller 804 can facilitate program, erase or read operations by applying suitable voltages at selected word lines.

A clock source(s) 808 can provide respective clock pulses to facilitate timing for read, write, and program operations of row control 804 and column control 806. Clock source(s) 808 can further facilitate selection of word lines or bit lines in response to external or internal commands received by operating and control environment 800. An input/output buffer 812 can be connected to an external host apparatus, such as a computer or other processing device (not depicted) by way of an I/O buffer or other I/O communication interface. Input/output buffer 812 can be configured to receive write data, receive an erase instruction, output readout data, and receive address data and command data, as well as address data for respective instructions. Address data can be transferred to row controller 804 and column controller 806 by an address register 810. In addition, input data is transmitted to memory cell array 802 via signal input lines, and output data is received from memory cell array 802 via signal output lines. Input data can be received from the host apparatus, and output data can be delivered to the host apparatus via the I/O buffer.

Commands received from the host apparatus can be provided to a command interface 814. Command interface 814 can be configured to receive external control signals from the host apparatus, and determine whether data input to the input/output buffer 812 is write data, a command, or an address. Input commands can be transferred to a state machine 816.

State machine 816 can be configured to manage programming and reprogramming of memory cell array 802. State machine 816 receives commands from the host apparatus via input/output interface 812 and command interface 814, and manages read, write, erase, data input, data output, and like functionality associated with memory cell array 802. In some aspects, state machine 816 can send and receive acknowledgments and negative acknowledgments regarding successful receipt or execution of various commands.

To implement read, write, erase, input, output, etc., functionality, state machine 816 can control clock source(s) 808. Control of clock source(s) 808 can cause output pulses configured to facilitate row controller 804 and column controller 806 implementing the particular functionality. Output pulses can be transferred to selected bit lines by column controller 806, for instance, or word lines by row controller 804, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 9, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 9:
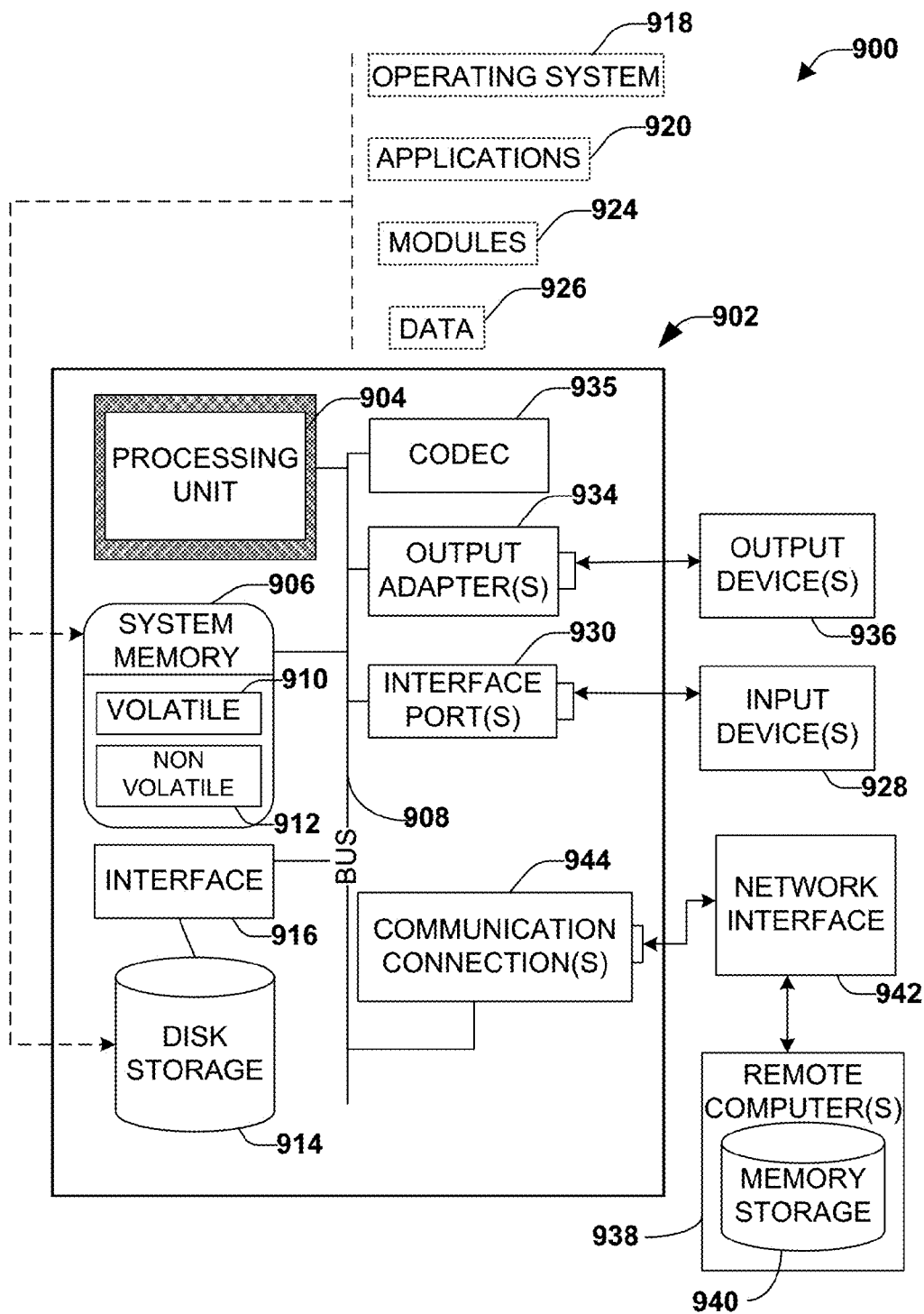
FIG. 9 illustrates a block diagram of an example computing environment that can be implemented in conjunction with various embodiments.

With reference to FIG. 9, a suitable environment 900 for implementing various aspects of the claimed subject matter includes a computer 902. The computer 902 includes a processing unit 904, a system memory 906, a codec 935, and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 910 and non-volatile memory 912, which can employ one or more of the disclosed memory architectures, in various embodiments. The basic input/output system (BIOS), containing the basic routines to transfer information between elements within the computer 902, such as during start-up, is stored in non-volatile memory 912. In addition, according to present innovations, codec 935 may include at least one of an encoder or decoder, wherein the at least one of an encoder or decoder may consist of hardware, software, or a combination of hardware and software. Although, codec 935 is depicted as a separate component, codec 935 may be contained within non-volatile memory 912. By way of illustration, and not limitation, non-volatile memory 912 can include read only memory (ROM), programmable ROM (PROM), electrically programmable ROM (EPROM), electrically erasable programmable ROM (EEPROM), or Flash memory. Non-volatile memory 912 can employ one or more of the disclosed memory architectures, in at least some disclosed embodiments. Moreover, non-volatile memory 912 can be computer memory (e.g., physically integrated with computer 902 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 910 includes random access memory (RAM), which acts as external cache memory. According to present aspects, the volatile memory may store the write operation retry logic (not shown in FIG. 9) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 902 may also include removable/non-removable, volatile/non-volatile computer storage medium. FIG. 9 illustrates, for example, disk storage 914. Disk storage 914 includes, but is not limited to, devices like a magnetic disk drive, solid state disk (SSD) floppy disk drive, tape drive, Jaz drive, Zip drive, LS-100 drive, flash memory card, or memory stick. In addition, disk storage 914 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 914 to the system bus 908, a removable or non-removable interface is typically used, such as interface 916. It is appreciated that storage devices 914 can store information related to a user. Such information might be stored at or provided to a server or to an application running on a user device. In one embodiment, the user can be notified (e.g., by way of output device(s) 936) of the types of information that are stored to disk storage 914 and/or transmitted to the server or application. The user can be provided the opportunity to opt-in or opt-out of having such information collected and/or shared with the server or application (e.g., by way of input from input device(s) 928).

It is to be appreciated that FIG. 9 describes software that acts as an intermediary between users and the basic computer resources described in the suitable operating environment 900. Such software includes an operating system 918. Operating system 918, which can be stored on disk storage 914, acts to control and allocate resources of the computer system 902. Applications 920 take advantage of the management of resources by operating system 918 through program modules 924, and program data 926, such as the boot/shutdown transaction table and the like, stored either in system memory 906 or on disk storage 914. It is to be appreciated that the claimed subject matter can be implemented with various operating systems or combinations of operating systems.

A user enters commands or information into the computer 902 through input device(s) 928. Input devices 928 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902 and to output information from computer 902 to an output device 936. Output adapter 934 is provided to illustrate that there are some output devices 936 like monitors, speakers, and printers, among other output devices 936, which require special adapters. The output adapters 934 include, by way of illustration and not limitation, video and sound cards that provide a means of connection between the output device 936 and the system bus 908. It should be noted that other devices and/or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 944 refers to the hardware/software employed to connect the network interface 942 to the bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, and so forth) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips), optical disks (e.g., compact disk (CD), digital versatile disk (DVD)), smart cards, and flash memory devices (e.g., card, stick, key drive). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory cell, comprising:
    a first electrode layer configured to generate ions in response to an electric field applied to the memory cell;
    a resistive ion migration layer at least in part permeable to migration of the ions within the resistive ion migration layer;
    a second electrode layer; and
    a substrate layer comprising a semiconductor substrate;
    wherein:
        the memory cell is configured to be a one-time programmable (OTP) memory device in response to an initial formation signal having a negative bias, wherein the initial formation signal is applied to the first electrode layer after fabrication of the memory cell.

2. The memory cell of claim 1, wherein the memory cell is configured to be a rewritable two-terminal memory cell in response to the initial formation signal having a positive bias.

3. The memory cell of claim 1, the first electrode comprising an Aluminum doped Zinc Oxide (AZO) material.

4. The memory cell of claim 1, wherein the resistive ion migration layer is comprised of an intrinsic ZnO material.

5. The memory cell of claim 1, wherein the second electrode layer comprises doped silicon (Si) bearing material.

6. The memory cell of claim 5, wherein the doped Si bearing material is selected from a group consisting of: p-type poly Si, n-type poly Si, p-type poly SiGe, and n-type poly SiGe.

7. The memory cell of claim 5, wherein a dopant concentration of the doped Si bearing material is between about 1E15 and about 1E21 atoms/cm3.

8. The memory cell of claim 1, wherein the substrate layer comprises a Si bearing material selected from a group consisting of: Si, SiGe, and GaAs.

9. The memory cell of claim 1, wherein the resistive ion migration layer is within a range of about 20 to about 100 nm thick.

10. The memory cell of claim 1, wherein the second electrode layer is within a range of about 20 to about 100 nm thick.

11. The memory cell of claim 1, wherein the memory cell is configured to comprise and retain a rectifier characteristic in response to application of the initial formation signal having the negative bias, wherein the rectifier characteristic resists current at the memory cell in response to application of a positive bias at the first electrode layer following the application of the initial formation signal having the negative bias.

12. The memory cell of claim 11, wherein the memory cell is configured to have a low resistance program state in response to a program signal having a negative program bias, and further wherein the rectifier characteristic mitigates or prevents erasure of the memory cell from the low resistance program state to a high resistance state.

13. A method of fabricating a memory cell comprising:
forming a substrate layer comprising a semiconductor substrate;
forming a second electrode layer, wherein the second electrode layer comprises a doped silicon (Si) material;
forming a resistive ion migration layer at least in part permeable to migration of a set of ions within the resistive ion migration layer, wherein the resistive ion migration layer comprises an intrinsic ZnO material; and
forming a first electrode layer configured to provide particles that are suitable to form the set of ions in response to an electric field applied to the memory cell, wherein the first electrode layer comprises an Aluminum doped Zinc Oxide (AZO) material.

14. The method of claim 13, further comprising:
applying an initial formation signal having a negative bias as a first bias applied to the first electrode layer after fabrication of the memory cell; and
preprogramming the memory cell to configure the memory cell as a one-time programmable (OTP) memory device in response to the applying the initial formation signal having the negative bias.

15. The method of claim 14, further comprising generating at least one response based on a voltage range of negative bias applied to the first electrode layer.

16. The method of claim 15, wherein the voltage range is between −1 volts and −6 volts and the at least one response is a first response, a second response, a third response, and a fourth response.

17. The method of claim 15, further comprising generating at least one response based on application of a current within a current range between about $10^{-4}$ and about $10^{-11}$ Angstroms to the first electrode layer.

18. The method of claim 16, wherein the first response is generated by applying a first voltage range between about 1 volts and about 5 volts, the second response is generated by applying a second voltage range between about 5 volts and about 5.5 volts, the third response is generated by applying a third voltage range between about 5.5 volts and about 6.0 volts, and the fourth response is generated by applying a fourth voltage range between about 6.0 volts and about 7.0 volts.

19. The method of claim 18, further comprising increasing or decreasing a thickness of the resistive ion migration layer resulting in an increase or a decrease in the first voltage range, the second voltage range, the third voltage range, and the fourth voltage range respectively.

20. An electronic device comprising an array of memory cells wherein the array comprises the following elements:
a memory cell element comprising a first electrode layer configured to generate ions in response to an electric field applied to the memory cell, a resistive ion migration layer at least in part permeable to migration of the ions within the resistive ion migration layer, a second electrode layer, and a substrate layer comprising a semiconductor substrate, wherein the memory cell element is configurable to be a one-time programmable (OTP) memory device in response to an initial formation signal having a negative bias applied to the first electrode layer, wherein the initial formation signal is applied to the first electrode layer after fabrication of the memory cell; and
a programming element configured to preprogram the memory cell element via application of the initial formation signal having the negative bias to the first electrode layer.

21. The electronic device of claim 20, wherein the one time programmable (OTP) memory device presents a diode characteristic comprising a rectification ratio ranging from about 100:1 to about 1000:1.

22. The electronic device of claim 20, wherein the memory cell element is further configurable to be a rewritable memory device in response to application of the initial formation signal having a positive bias applied to the first electrode layer, and the programming element is further configured to preprogram the memory cell element via application of the initial formation signal having the positive bias to the first electrode layer.

* * * * *